(12) United States Patent
Feld et al.

(10) Patent No.: US 6,285,305 B1
(45) Date of Patent: Sep. 4, 2001

(54) ANALOG-TO-DIGITAL CONVERTER CIRCUIT

(75) Inventors: Peter Feld, Nuernberg; Horst Kroeckel, Bamberg; Markus Vester, Nuernberg, all of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/538,358

(22) Filed: Mar. 29, 2000

(30) Foreign Application Priority Data

Mar. 29, 1999 (DE) ............................................. 199 14 207

(51) Int. Cl.$^7$ .............................. H03M 1/62; H03M 1/12
(52) U.S. Cl. ........................................... 341/139; 341/155
(58) Field of Search ................................. 341/139, 155

(56) References Cited

U.S. PATENT DOCUMENTS

| 4,739,307 | 4/1988 | Marcovici et al. | 341/122 |
|---|---|---|---|
| 4,851,842 | * 7/1989 | Iwamatsu | 341/139 |
| 5,093,660 | 3/1992 | Beauducel | 341/155 |
| 5,422,643 | 6/1995 | Chu et al. | 341/141 |
| 5,546,081 | 8/1996 | Baumgartl | 341/155 |
| 5,760,727 | * 6/1998 | Lin | 341/155 |
| 5,844,512 | 12/1998 | Gorin et al. | 341/155 |
| 6,094,153 | * 7/2000 | Rumsey et al. | 341/155 |

FOREIGN PATENT DOCUMENTS

| 0 911 976 | 9/1998 | (EP) . |
|---|---|---|
| 2 040 125 | 8/1980 | (GB) . |

* cited by examiner

*Primary Examiner*—Trong Phan
(74) *Attorney, Agent, or Firm*—Schiff Hardin & Waite

(57) ABSTRACT

An analog-to-digital converter circuit has pre-sample and hold circuit for acquiring and temporarily storing a supplied analog input signal, and for outputting the temporarily stored input signal, at least two signal paths, which are arranged downstream relative to the pre-sample and hold circuit and which are switched in parallel with one another, the temporarily stored input signal sample from the pre-sample and hold circuit being subjected to respective fixed amplifications, which are different from one another, in said signal paths and a selection circuit arranged downstream relative to the signal paths for through-connecting only one of the signal paths, dependent on the respective signal levels, to an analog-to-digital converter that is arranged downstream relative to the selection circuit.

10 Claims, 2 Drawing Sheets

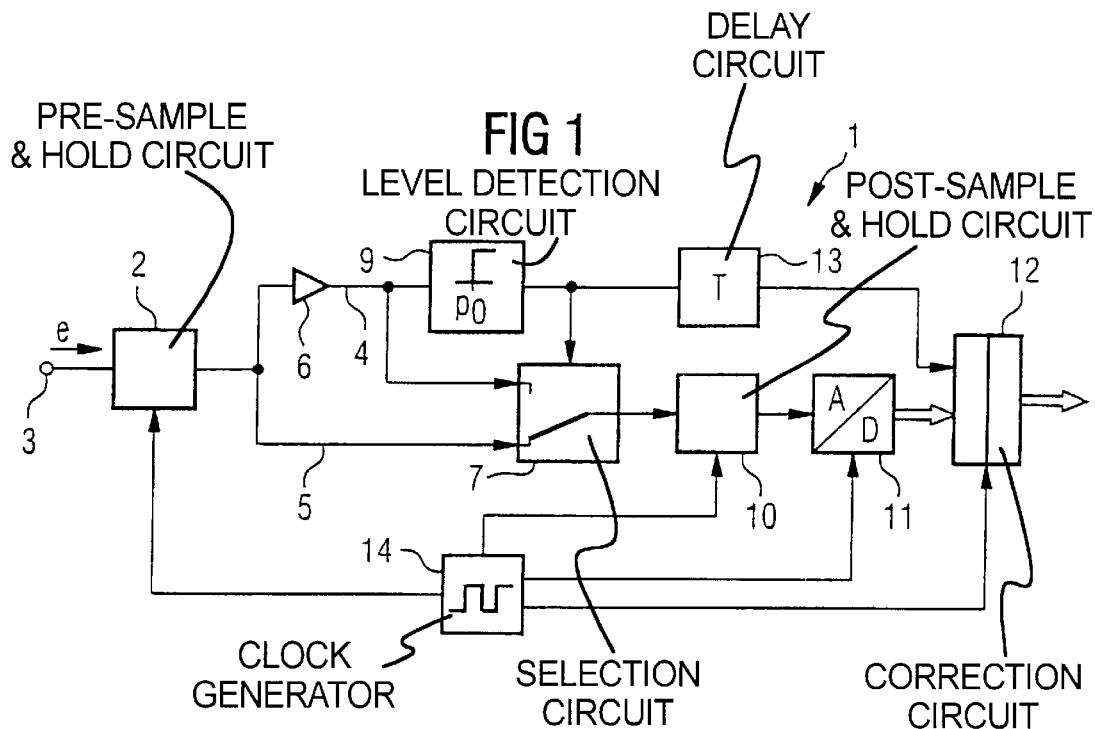
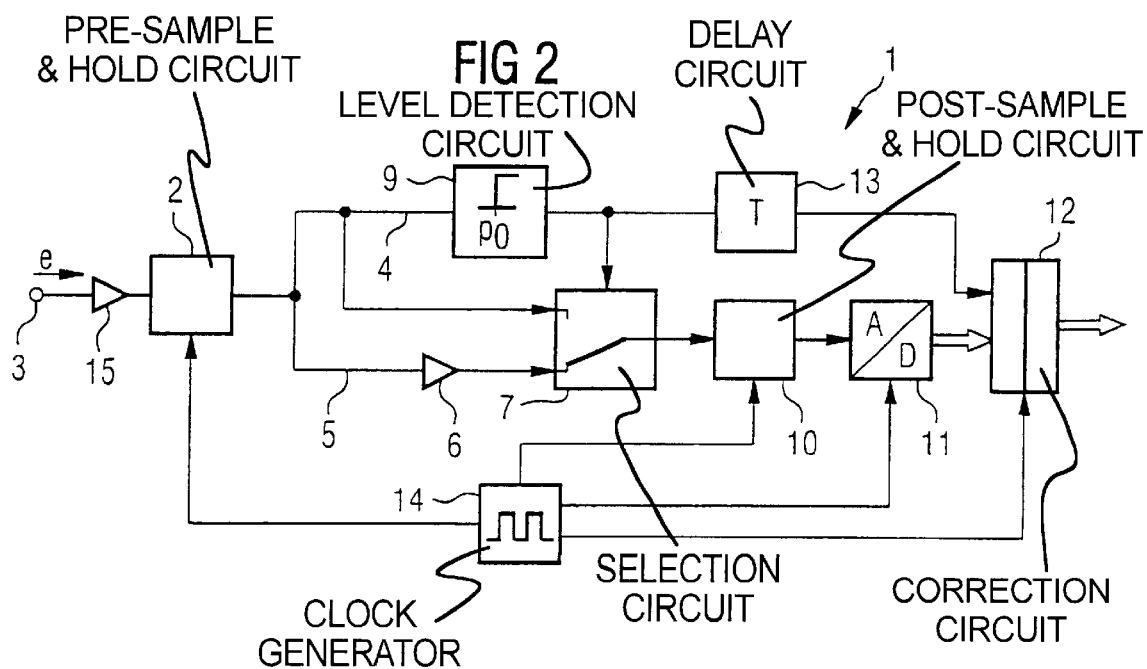

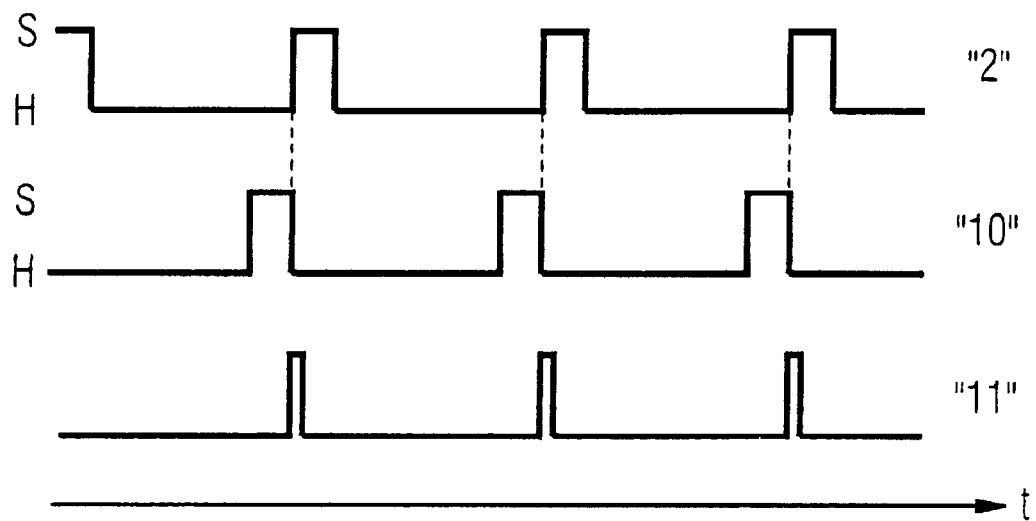
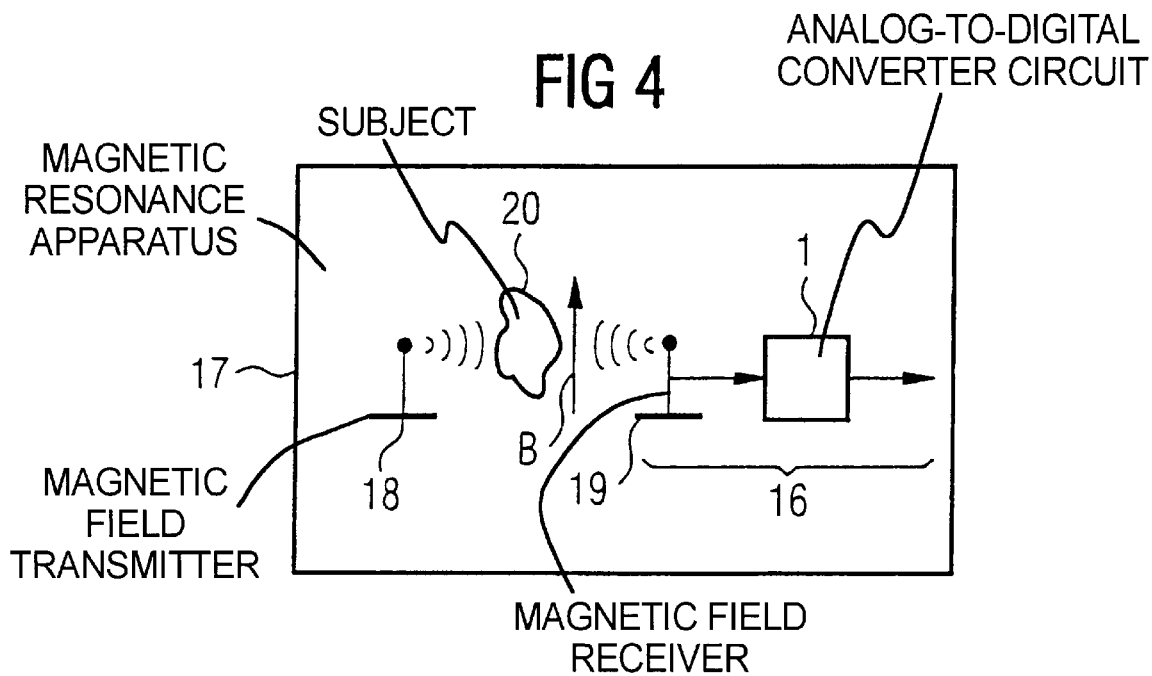

ANALOG-TO-DIGITAL CONVERTER CIRCUIT

BACKGROUND OF THE INVENTION

1. Field of the Invention

The present invention is directed to an analog-to-digital converter circuit.

2. Description of the Prior Art

U.S. Pat. No. 5,546,081 and the corresponding German OS 43 19 256 disclose an analog-to-digital converter circuit for purposes of digitalizing an amplitude-modulated analog high-frequency signal. The analog-to-digital converter circuit is composed of an analog-to-digital converter with a controllable amplifier that is connected upstream and with a digital divider that is connected downstream. The amplification of the controllable amplifier and the division of the divider compensate each other. The control signals for the amplifier and for the divider are determined by means of a level recognition element and are prescribed with respect to the amplifier and the divider.

This known analog-to-digital converter circuit has the disadvantage of making high demands regarding the linearity of the digitalization. These demands can be only fulfilled when the amplifier has constant amplification factors that can be precisely adjusted and when the analog-to-digital converter in the circuit is highly linear. Another significant problem is that the amplification must be adjusted extremely fast given changes of the amplification.

German Translation 690 11 998 (of European Patent 0 406 080) discloses an analog-to-digital converter circuit with two signal paths that are switched in parallel with one another, with a common input signal being supplied to these paths. A sample and hold circuit is arranged in each of the signal paths; the output signals of these sample and hold circuits, in alternation being supplied to an analog-to-digital converter via a switching unit. An amplifier with an adjustable amplification factor (gain) is arranged upstream relative to one of the sample and hold circuits.

European Application 0 911 976 (not published before the convention priority data of the present application) describes an analog-to-digital converter circuit with a sample and hold circuit, with an amplifier with an adjustable amplification connected downstream, and an analog-to-digital converter arranged downstream from this amplifier.

U.S. Pat. No. 5,422,643 discloses an analog-to-digital converter circuit with a number of signal paths that are switched in parallel with one another. In each of in these said signal paths, a common input signal is subjected to respective fixed amplifications that are different from one another. A selection circuit through-connects only one of the signal paths to an analog-to-digital converter that is connected downstream relative to the selection circuit, dependent only the respective signal levels (amplitudes) in the signal paths.

U.S. Pat. No. 4,739,307 discloses an analog-to-digital converter circuit having an amplifier with an adjustable amplification (gain), with a sample and hold circuit arranged downstream relative to the amplifier, and a selection circuit and an analog-to-digital converter arranged downstream relative to the sample and hold circuit.

U.S. Pat. No. 5,844,512 discloses an analog-to-digital converter circuit, wherein an analog input signal is supplied to an amplifier with an adjustable amplification. The output signal of the amplifier is supplied to an analog-to-digital converter, which is arranged downstream, via a sample and hold circuit.

SUMMARY OF THE INVENTION

An object of the present invention is to provide an analog-to-digital converter circuit that does not require high precision components and yet provides a high linearity in a large dynamic range from input signal to output signal.

This object is achieved by means of an analog-to-digital converter circuit having a pre-sample and hold circuit for acquiring and temporarily storing (holding) a supplied analog input signal and for subsequently emitting the temporarily stored input signal as an output, at least two signal paths, which are downstream relative to the pre-sample and hold circuit and which are switched in parallel with one another, with output from the pre-sample and hold circuit being subjected to respectively different fixed amplification, in these signal paths, and a selection circuit arranged downstream relative to the signal paths for through-switching only one of the signal paths, dependent on the signal level, to an analog-to-digital converter that is arranged downstream relative to the selection circuit.

The structure of the analog-to-digital converter circuit is particularly simple when the amplification equals one in one of the signal paths. The amplification can be alternatively greater than one or less than one in the other one of the signal paths.

The amplification can be realized in a particularly simple way with purely passive components (such as a resistance divider circuit) when the amplification is less than one. As warranted, it can be necessary to undertake a pre-amplification of the analog input signal before or after the pre-sample and hold circuit.

The analog-to-digital converter circuit can process data at a higher rate in an embodiment wherein when a post-sample and hold circuit is arranged between the selection circuit and the analog-to-digital converter. The two sample and hold circuits can be identically fashioned.

Compensation of linearity distortions or errors is in an embodiment wherein a correction circuit is arranged downstream relative to the analog-to-digital converter for correcting linearity distortions.

The range of values of the digitalized signal can be adjusted together with the linearity correction when the selection circuit is connected to the correction circuit. A delay element preferably is arranged between the selection circuit and the correction circuit for compensating for the conversion time associated with the analog-to-digital conversion.

The inventive analog-to-digital converter circuit can be utilized in a reception device of a magnetic resonance device, in particular.

DESCRIPTION OF THE DRAWINGS

FIG. 1 is a block diagram of a first embodiment of an analog-to-digital converter circuit constructed and operating in accordance with the principles of the present invention.

FIG. 2 is a block diagram of a second embodiment of an analog-to-digital converter circuit constructed and operating in accordance with the principles of the present invention.

FIG. 3 is diagram illustrating control signals for the inventive analog-to-digital converter circuit for both of the embodiments of FIG. 1 and FIG. 2.

FIG. 4 is a schematic diagram of a magnetic resonance apparatus embodying an analog-to-digital converter circuit constructed and operating in accordance with the principles of the present invention.

DESCRIPTION OF THE PREFERRED EMBODIMENTS

As shown in FIG. 1, an analog-to-digital converter circuit (generally referenced 1) includes a pre-sample and hold circuit 2 ("sample-and-hold-storage"), which acquires and temporarily holds (stores) an analog input signal e, from an input 3.

Two signal paths 4, 5 that are switched in parallel with one another are arranged downstream relative to the pre-sample and hold circuit 2. The pre-sample and hold circuit 2 outputs the temporarily stored input signal e to both signal paths 4, 5. In the signal paths 4, 5, the input signal e is subjected to respective fixed amplifications that are different from one another. According to FIG. 1, the amplification in the signal path 4 is greater than one and equals one in the signal path 5 due to the amplifier 6.

The output signal of the amplifier is also supplied to a level detection circuit 9, which is allocated to the selection circuit 7. When the level detection circuit 9 detects that the amplified input signal lies above a limiting level p0, the selection circuit 9 is driven such that the unamplified input signal e is through-connected by the selection circuit 7. Otherwise, the selection circuit 7 through-connects the amplified input signal. Therefore, only one of the signal paths 4, 5 is through-connected at a time.

The through-connected signal is supplied to a post-sample and hold circuit 10. The post-sample and hold circuit 10 can be fashioned in the same way as the pre-sample and hold circuit 2. The post-sample and hold circuit 10 supplies the through-connected signal to an analog-to-digital converter 11. The analog-to-digital converter 11 digitalizes the supplied analog signal with an exactness of 12 bit, for example.

The signal that is digitalized by the analog-to-digital converter 11 is supplied to a correction circuit 12. The correction circuit 12 corrects non-linearities which may exist in the analog-to-digital converter 11. Further, the correction circuit 12 is connected to the level detection circuit 9 via a delay element 13. The delay element 13 serves the purpose of compensating for the conversion time T, which is required by the analog-to-digital converter 11 in order to convert the supplied analog signal into a digital value.

Therefore, altogether 13 bits—namely 12 bits from the analog-to-digital converter 11 and one bit from the delay element 13—are supplied to the correction circuit 12 according to FIG. 1. The correction circuit 12 has an output width of 16 bits. Subsequent to the through-connection of the amplified input signal by the selection circuit 7, the correction circuit 12 emits a signal, of which the four higher-order bits are zero. The 12 low-order bits are determined by the—possibly corrected—output signal of the analog-to-digital converter 11. When the unamplified input signal e is through-connected by the selection circuit 7, however, the output signal of the analog-to-digital converter 11 determines the 12 higher-order bits of the signal emitted by the correction circuit 12. Then, the four lowest-order bits are zero.

Further, it can be seen from FIG. 1 that the analog-to-digital converter 1 includes a clock generator 14. The sample and hold circuits 2, 10, the analog-to-digital converter 11 and the correction circuit 12 are clocked by means of the clock generator 14. The clocking ensues with a sampling rate that lies far above 1 MHZ. The sampling rate preferably lies between 5 MHZ and 100 MHZ.

FIG. 3 shows the clocking of the sample and hold circuits 2, 10. In FIG. 3, S stands for "sample", i.e. sampling the input signal e, H for "hold" i.e., holding the input signal e. The time axis is referred to as t. In addition, FIG. 3 also shows the clock signals, at which times the analog-to-digital converter 11 accepts a new sample of the input signal e. The digitalization of the input signal e subsequently ensues in the clock pauses.

Due to the pipeline structure of the analog-to-digital converter circuit 1 with two sample and hold circuits 2, 10, the analog-to-digital converter 11 can convert an already-sampled input signal e while the input signal 3 is newly sampled and proceeds through the signal paths 4, 5 and the selection circuit 7. Therefore, the transient times of the amplifier 6 and of the selection circuit 7 are allowed to be almost as long as the conversion time T of the analog-to-digital converter 11.

FIG. 2 shows a further embodiment of the inventive analog-to-digital converter circuit 1. Identical reference numbers are used for identical elements. The analog-to-digital converter circuit 1 according to FIG. 2 differs from the analog-to-digital converter circuit 1 according to FIG. 1 in that the amplification equals one in the one signal path 4, whereas an attenuation of the signal ensues in the other signal path 5, i.e. the amplifier 6 has an amplification less than one. As a result, the amplifier 6 can be constructed with purely passive elements, as a resistance divider circuit, for example. If required, the input signal e can be amplified before the pre-sample and hold circuit 2 by means of a pre-amplifier 15.

The inventive analog-to-digital converter circuit 1 can be utilized for different application purposes. Utilization in a reception device 16 of a magnetic resonance apparatus 17 is particularly advantageous (as shown in FIG. 4). The magnetic resonance apparatus 17 has a magnetic field transmitter 18 and a magnetic field receiver 19. The signal of the magnetic field transmitter 18 excites nuclear spins in an object 20, which is exposed to a basic magnetic field B. Then, the resulting magnetic resonance signal is processed as the input signal e in the analog-to-digital converter circuit 1 according to FIG. 1 or FIG. 2, prior to a digital further processing.

Although modifications and changes may be suggested by those skilled in the art, it is the intention of the inventors to embody within the patent warranted hereon all changes and modifications as reasonably and properly come within the scope of their contribution to the art.

We claim as our invention:

1. An analog-to-digital converter circuit comprising:
    a pre-sample and hold circuit supplied with an analog input signal, said pre-sample and hold circuit temporarily storing said input signal and emitting a temporarily stored input signal;
    a first signal path and a second signal path connected in parallel downstream from pre-sample and hold circuit and each being supplied with said temporarily stored input signal, said first signal path having a first amplification factor and said second signal path having a second amplification factor different from said first amplification factor;
    a switch having a first input connected to said first signal path and a second input connected to said second signal path and an output;
    a level detection circuit for operating said switch to through-connect one of said first signal path and said second signal path to said output of said switch dependent on a signal level in one of said first signal path and said second signal path; and an analog-to-digital converter having an input connected to said output of said switch.

2. An analog-to-digital converter circuit as claimed in claim 1 wherein one of said first amplification factor and said second amplification factor is 1.

3. An analog-to-digital converter circuit as claimed in claim 1 wherein one of said first amplification factor and said second amplification factor is less than 1.

4. An analog-to-digital converter circuit as claimed in claim 1 wherein one of said first amplification factor and said second amplification factor is greater than 1.

5. An analog-to-digital converter circuit as claimed in claim 1 further comprising a pos-sample and hold circuit connected between said output of said switch and said input of said analog-to-digital converter.

6. An analog-to-digital converter circuit as claimed in claim 5 wherein said post-sample and hold circuit is identical to said pre-sample and hold circuit.

7. An analog-to-digital converter circuit as claimed in claim 1 wherein said analog-to-digital converter exhibits linearity distortions, and has an output, and further comprising a correction circuit connected to said output of said analog-to-digital converter for correcting said linearity distortions.

8. An analog-to-digital converter circuit as claimed in claim 7 wherein said correction circuit is connected to said level detection circuit and corrects said linearity distortions dependent on said signal level.

9. An analog-to-digital converter circuit as claimed in claim 8 wherein said analog-to-digital converter has a conversion time associated therewith, and further comprising a delay element connected between said level detection circuit and said correction circuit for compensating for said conversion time.

10. An analog-to-digital converter circuit as claimed in claim 1 further comprising means for obtaining a magnetic resonance signal and for supplying said magnetic resonance signal to said pre-sample and hold circuit as said input signal.

* * * * *